US008612823B2

(12) United States Patent
Sutskover (10) Patent No.: US 8,612,823 B2
(45) Date of Patent: Dec. 17, 2013

(54) ENCODING OF LDPC CODES USING SUB-MATRICES OF A LOW DENSITY PARITY CHECK MATRIX

(75) Inventor: Ilan Sutskover, Hadera (IL)

(73) Assignee: Intel Corporation, Santa Clara, CA (US)

( * ) Notice: Subject to any disclaimer, the term of this patent is extended or adjusted under 35 U.S.C. 154(b) by 660 days.

(21) Appl. No.: 12/498,167

(22) Filed: Jul. 6, 2009

(65) Prior Publication Data

US 2010/0100790 A1 Apr. 22, 2010

Related U.S. Application Data

(60) Provisional application No. 61/106,316, filed on Oct. 17, 2008.

(51) Int. Cl.
*H03M 13/00* (2006.01)
(52) U.S. Cl.
USPC ............ 714/758; 714/752; 714/800; 714/801
(58) Field of Classification Search
None
See application file for complete search history.

(56) References Cited

U.S. PATENT DOCUMENTS

| | | | |
|---|---|---|---|
| 6,895,547 B2 | 5/2005 | Eleftheriou et al. | |
| 7,278,082 B2 | 10/2007 | Kim et al. | |
| 2006/0123314 A1* | 6/2006 | Kim et al. | 714/758 |
| 2007/0283219 A1* | 12/2007 | Park et al. | 714/758 |
| 2008/0178065 A1* | 7/2008 | Khandekar et al. | 714/801 |
| 2009/0049363 A1* | 2/2009 | Hocevar | 714/758 |
| 2009/0106620 A1* | 4/2009 | Yokokawa | 714/752 |
| 2009/0217132 A1* | 8/2009 | Senda | 714/752 |
| 2010/0088573 A1* | 4/2010 | Lakkis | 714/758 |
| 2010/0153812 A1* | 6/2010 | Jin et al. | 714/752 |
| 2010/0251065 A1* | 9/2010 | Livshitz | 714/752 |
| 2011/0167315 A1* | 7/2011 | Kyung et al. | 714/752 |
| 2012/0166914 A1* | 6/2012 | Khandekar et al. | 714/776 |

FOREIGN PATENT DOCUMENTS

| | | |
|---|---|---|
| EP | 1443656 | 8/2004 |
| JP | P2003-115768 | 4/2003 |
| JP | P2004-236313 | 8/2004 |
| JP | 2006-519560 | 8/2006 |
| WO | 2004/019268 | 3/2004 |
| WO | 2004/077733 | 9/2004 |

OTHER PUBLICATIONS

Seho Myung; Kyeongcheol Yang; Youngkyun Kim; , "Lifting methods for quasi-cyclic LDPC codes," Communications Letters, IEEE , vol. 10, No. 6, pp. 489-491, Jun. 2006, doi: 10.1109/LCOMM.2006. 1638625.*

Japanese Office Action received Jan. 23, 2011.

(Continued)

*Primary Examiner* — M. Mujtaba K Chaudry
*Assistant Examiner* — Justin R Knapp
(74) *Attorney, Agent, or Firm* — Pillsbury Winthrop Shaw Pittman LLP (57) ABSTRACT

A method and apparatus are disclosed that include encoding an information word to generate a codeword using a systematic low density parity check matrix using an encoder, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoding performed over the second sub-matrix before the third sub-matrix.

20 Claims, 6 Drawing Sheets

(56) References Cited

OTHER PUBLICATIONS

European Search Opinion dated Dec. 7, 2010.
European Communication dated Nov. 2, 2011.
MacKay et al., "Comparison of constructions of irregular Gallager codes", IEEE Transactions on Communications, IEEE Service Center, Oct. 1, 1999, vol. 47, No. 10.
Thomas J. Richardson, et al. "Efficient Encoding of Low-Density Parity-Check Codes"; *IEEE Transactions on Information Theory*; vol. 47, No. 2; Feb. 2001.
Dale E. Hocevar, "Efficient Encoding for a Family of Quasi-cyclic LDPC Codes" IEEE Standards; 2003.
Fred Daneshgaran, et al. "LDPC-Based Iterative Algorithm for Compression of Correlated Sources at Rates Approaching the Slepian-Wolf Bound"; Oct. 30, 2007.

\* cited by examiner

Appendix A

$$\begin{matrix} 11 & -1 & 25 \\ -1 & 7 & 21 \\ 0 & 0 & 0 \end{matrix}$$

Figure 5

$$\begin{pmatrix} 3 & 7 & 14 \\ 3 & 7 & 14 \\ 17 & 21 & 0 \end{pmatrix} + \begin{pmatrix} 17 & -1 & -1 \\ -1 & 21 & -1 \\ -1 & -1 & -1 \end{pmatrix}$$

Figure 8:
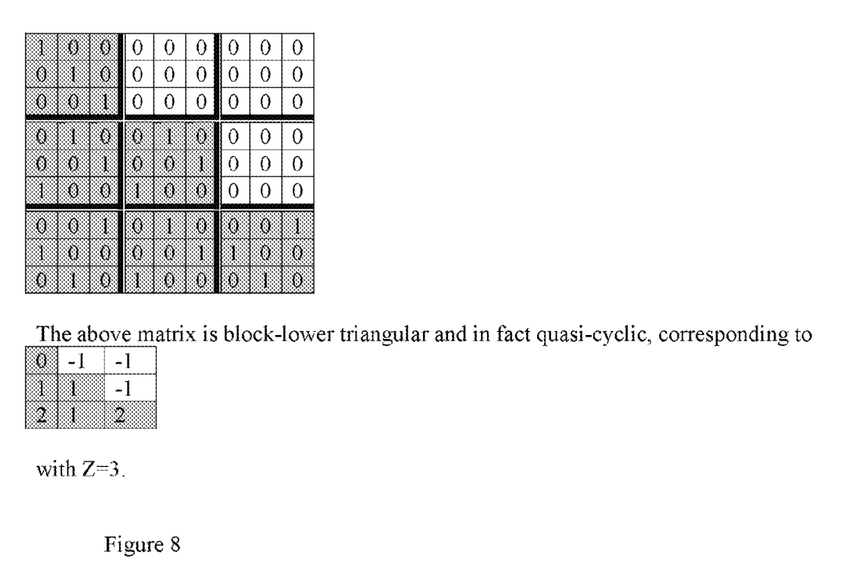
FIG. 8 shows a block-lower triangular matrix that is quasi-cyclic, corresponding to Z=3 in accordance with various aspects of the present disclosure.

The above matrix is block-lower triangular and in fact quasi-cyclic, corresponding to

| 0 | -1 | -1 |
| 1 | 1 | -1 |
| 2 | 1 | 2 | with Z=3.

ENCODING OF LDPC CODES USING SUB-MATRICES OF A LOW DENSITY PARITY CHECK MATRIX

CROSS-REFERENCE TO RELATED APPLICATIONS

This application claims benefit under 35 U.S.C. §119(e) from U.S. Provisional Application No. 61/106,316 filed on Oct. 17, 2008, incorporated herein by reference in its entirety.

BACKGROUND

This disclosure relates generally to the field of error correction in a communication system, and in particular, to a method and apparatus for encoding using low density parity check (LDPC) codes.

In communication systems, the link performance is affected by various noises in channels, a fading phenomenon, and Inter-Symbol Interference (ISI). Therefore, in order to realize high-speed digital communication systems requiring high data throughput and reliability, such as in the 60 GHz personal area network (PAN), next-generation mobile communication, digital broadcasting, and portable internet, it is advantageous to develop a technology for operating in the presence of noise, fading and ISI. Error-correcting codes are typically used for increasing communication reliability by efficiently recovering distorted information.

Low density parity check (LDPC) codes are used for error correcting in noisy channels and appear in various wireless and wired standards. LDPC codes are linear block codes, and as such, can be represented by a parity check matrix. LDPC codes are low density parity check codes, which means that their parity check matrix is sparse. A sparse matrix has very few non-zero entries. Systematic LDPC codes are codes such that the information symbols are an explicit part of the codeword.

Figure 1:
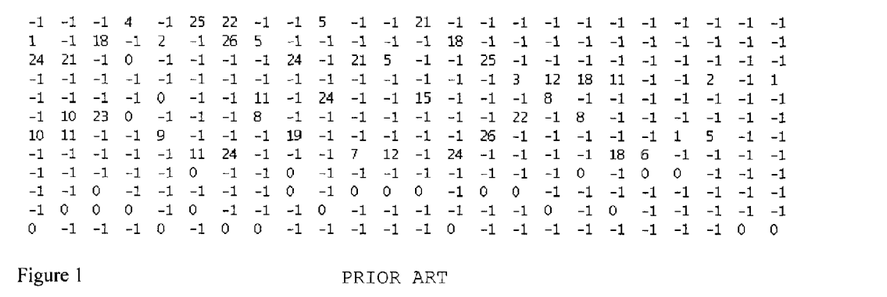
FIG. 1 shows an example for a rate 1/2 LDPC code, with Z=28.
Figure 2:
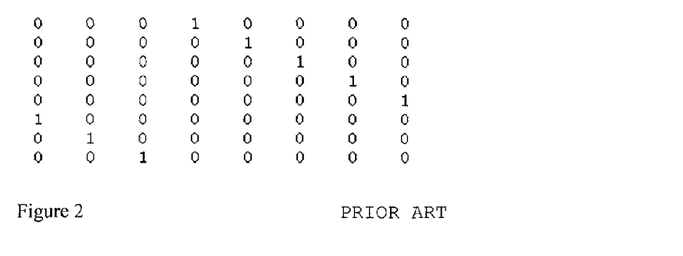
FIG. 2 shows an example of a 8×8 cyclic permutation matrix.

Quasi-cyclic (QC) LDPC matrices are common as they can be concisely described. An example for QC LDPC matrix (binary rate ½ LDPC code, with Z=28) is shown in FIG. 1. The code rate represents the ratio of information to parity bits. For the ½ rate example above, half of the bits of a codeword are information bits and the other half are parity check bits. A "−1" entry in the matrix represents a Z×Z matrix having all zeros. Each other entry in this matrix represents a permutation matrix of size Z×Z. Thus, if the exemplified matrix has 24 columns and if Z=28, then this matrix is associated with a 28*24=672 bit code. A permutation matrix is a matrix that has a single "1" in each row and a single "1" in each column. For example, the matrix as shown in FIG. 2 is a 8×8 permutation matrix. Moreover, the exemplified permutation matrix is a cyclic permutation matrix. The QC LDPC is made of cyclic permutation matrices. An entry that is not "−1" is the amount of cyclic permutation of the submatrix.

The present disclosure holds for LDPC codes defined over any Galois field, but for brevity and better insight, the discussion and examples of the present disclosure are confined to Galois field of size 2, meaning the binary field. When LDPC codes over other fields are considered, the main properties required by this disclosure remain the same, which are the following: the matrix structure after reordering and the invertibility of sub-matrix D, described below.

BRIEF SUMMARY

Not Applicable

DETAILED DESCRIPTION

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, a method is disclosed that includes encoding an information word to generate a codeword using a low density parity check matrix using an encoder, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoding performed over the second sub-matrix before the third sub-matrix.

In accordance with various embodiments of this disclosure, an apparatus is disclosed that includes an encoder configured to encode an information word to generate a codeword using a low density parity check matrix, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoder configured to perform the encoding over the second sub-matrix before the third sub-matrix.

In accordance with various embodiments of this disclosure, a computer program product is disclosed that includes a computer usable medium having a computer readable program code embodied therein, said computer readable program code adapted to be executed to implement a method comprising encoding an information word to generate a codeword using a low density parity check matrix, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoding performed over the second sub-matrix before the third sub-matrix.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various Figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

Figure 3:
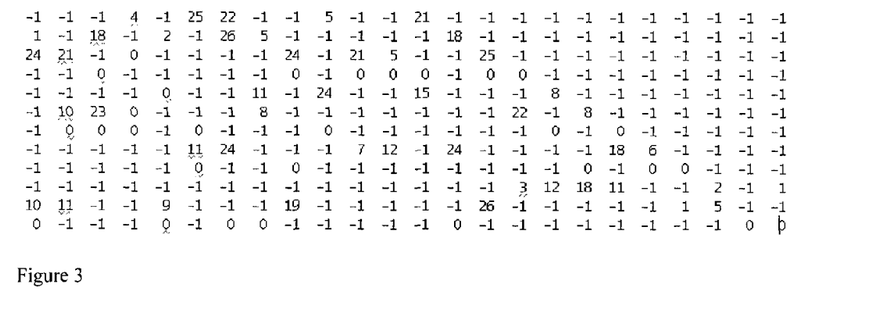
FIG. 3 shows a matrix like that shown in FIG. 1, with row permutations only in accordance with various aspects of the present disclosure.
Figure 4:
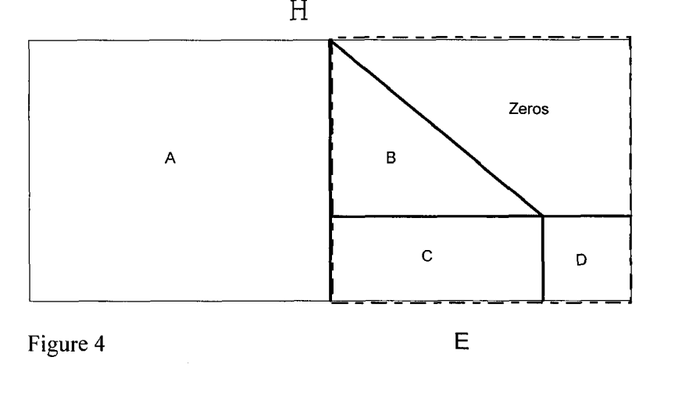
FIG. 4 shows a matrix structure for encoding in accordance with various aspects of the present disclosure.

Turning now to the various aspects of the disclosure, an encoding technique is described using systematic LDPC codes that can be brought to a structure by row and column permutations as depicted in matrix H shown in FIG. 4, as exemplified also in FIG. 3. It is known to those skilled in the art that a parity check matrix with reordered rows correspond to the same code as without reordering and that reordering of columns corresponds to reordering of the symbols in the codeword, such that this reordering can be inverted at the end of the encoding process if one desires. It should be appreciated that operations such as reordering of rows and columns do not change the sparseness of the matrix. Any systematic code may be brought to the structure depicted in FIG. 4 as matrix H using reordering of rows and columns. In the embodiment illustrated in FIG. 4, the columns associated with sub-matrix A correspond to information symbols. The columns associated with sub-matrices B and C correspond to a first part of the parity symbols. The columns associated with sub-matrix D correspond to a second part of the parity symbols. In an aspect of the present disclosure, the codes may be constructed using the structure of matrix H as depicted in FIG. 4; however, other structures may be used such that the matrix can be brought to this structure using steps such as row reordering, etc. Matrices that are brought in the form of the structure as depicted in FIG. 4 should be considered similar to a matrix that originally has the form of FIG. 4. for encoding purposes.

Each entry in matrix H represents a permutation matrix or a zero matrix of size Z×Z. A plurality of the permutation matrices can be formed by permuting at least one base permutation matrix according to a predetermined regularity. For instance, if a base permutation matrix is set to a Z×Z identity matrix, a plurality of permutation matrices can be generated from shifting all rows of the base permutation matrix in a specific direction by a predetermined interval, exchanging a specific row (or column) of the base permutation matrix for another random row (or column) of the base permutation matrix, rotating the base permutation matrix by a predetermined angle or the like.

Figure 5:
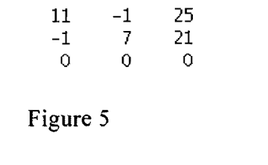
FIG. 5 shows an exemplary sub-matrix D in accordance with various aspects of the present disclosure.
Figure 6:
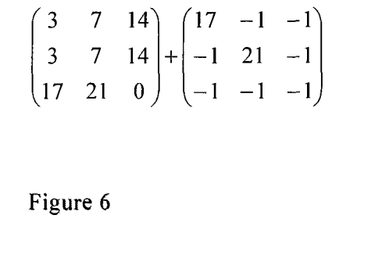
FIG. 6 shows the inverse of the exemplary sub-matrix D of FIG. 5 in accordance with various aspects of the present disclosure.
Figure 7:
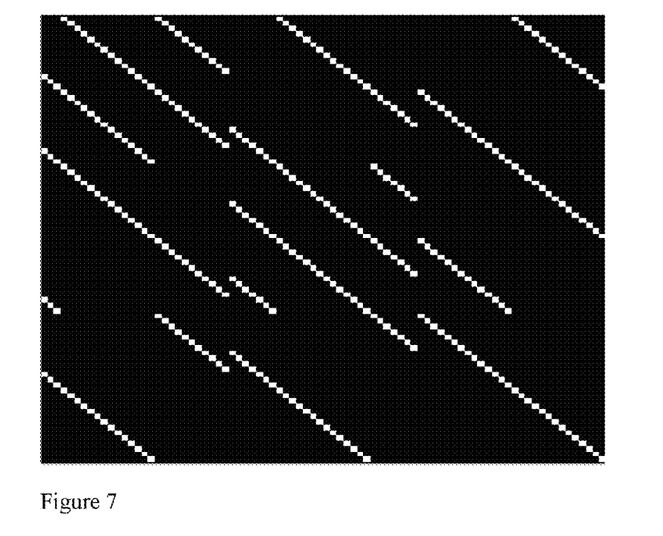
FIG. 7 shows a representation of the inverse matrix of FIG. 6 in accordance with various aspects of the present disclosure.

In some aspects of the present disclosure, sub-matrix D may have a sparse inverse. For example, consider sub-matrix D as given by the matrix as shown in FIG. 5, with Z=28, which is a representation of a 3*28×3*28 binary matrix, whose inverse has the representation of the sum of two quasi-cyclic matrices and this representation is shown in FIG. 6, and thus this inverse is also sparse. Each entry in the inverse matrix represents a cyclic permutation matrix, with Z=28 in this example. The 3*28×3*28 inverse matrix is shown in FIG. 7, where the white dots represent "1" and black portion of the matrix represents "0." In some aspects, the sub-matrix D may have an inverse, but the inverse may not be sparse, or it may not have to be the sum of two quasi-cyclic (QC) matrices.

The codeword includes information symbols corresponding to columns of the first sub-matrix, parity symbols corresponding to columns of the second sub-matrix and parity symbols corresponding to columns of the third sub-matrix. For example, the codeword (cw) can be represented as the concatenation of the information symbols and of the parity symbols that may be stated as two vectors, p and q, which together form the codeword, cw=[u p q], wherein u are the information symbols corresponding to the columns of A, p are some of the parity symbols corresponding to the columns of B and C, and q are the rest of the parity symbols corresponding to the columns of D. The length of the codeword is determined by the product of Z and the number of columns in the LDPC matrix. For example, If Z=28 and the number of columns is 24, then the codeword is 672 symbols in length. Alternatively, other size codewords may be used.

The condition H times cw=0 is a property of parity check matrices and their codewords. A vector of symbols is a codeword if and only if the multiplication of the parity check matrix by this vector is 0, where the additions/summations are over the relevant Galois field (binary in this example, but the disclosure is not limited in this respect). Denote the portion of the parity check matrix excluding sub-matrix A by submatrix E and denote the vector of parity symbols by r=[p q] then the condition H times cw=0 is equivalent to the expression $[A\ E] \times [u\ r]^T = Au + Er = 0$, wherein superscript T is the transpose of the vector [u r]. A transpose operation T on a row vector would result in a column vector. The mathematics described throughout the various aspects is algebra over a Galois field. Thus, above expression can be separated into Au=−Er. This gives rise to a method of solving for the vector r given vector u as described next. The encoding procedure described below is demonstrated over the binary field, in which case symbols are bits. Those skilled with the art will be able to apply the procedure also to LDPC codes over other Galois fields.

The encoding begins by calculating a product of the first sub-matrix, A, and a vector representing the information bits corresponding to columns of the first sub-matrix, u. The product can be represented as a vector, z, having a first part corresponding to rows of the second sub-matrix and a second part corresponding to rows of the third sub-matrix. The product, z, is then equal to the vector [x y], where x corresponds to the rows of B and y corresponds to the rows of C or D.

The encoding continues by calculating parity bits corresponding to columns of the second sub-matrix by backward or forward substitution using the second sub-matrix and the first part of the vector corresponding to rows of the second sub-matrix. In some aspects, the second (B) sub-matrix may be a lower-block-triangular matrix and, thus, the bits associated with columns of sub-matrices B and C can be solved for using forward substitution block by block. FIG. 8 shows a block-lower triangular matrix that is quasi-cyclic, corresponding to Z=3. Likewise, in some aspects, the second (B) sub-matrix may be a upper-block-triangular matrix, and thus, the bits associated with columns of matrices B and C can be solved for using backward substitution block by block. Other substitution methods may be used when the sub-matrix is not in a strict triangular form, such as when a lower triangular matrix has its first two rows shifted to the end. For QC matrices, blockiness of the triangular matrix is an inherent property, of course. In general, the sub-matrices may be of size 1×1, where the block-triangular is actually strictly triangular.

The encoding continues by calculating a sum, as represented by zz, of the second part of the vector corresponding to rows of the third sub-matrix, y, and a product of a fourth sub-matrix of the parity check matrix, C, and parity bits associated with the second sub-matrix, p. In other words, zz=−(y+Cp).

The encoding concludes by calculating parity bits associated with the third sub-matrix, q, by using the calculated sum, zz, and the inverse of the third sub-matrix, D.

Each submatrix of the parity check matrix represents either an invertible matrix or an all-zero matrix of size Z×Z. The invertible matrix may be a permutation matrix. In accordance with some aspects of the various disclosed embodiments, Z is equal to 28 or 42. Alternatively, other values of Z may be used. In some aspects, the third matrix has an inverse matrix which is sparse.

In some aspects, the encoding may be performed by a specific-purpose computer operating with encoding instructions stored in a memory of the computer. The stored instructions may cause one or more processors or controllers within the computer to perform a series of operations on the codeword and parity bits of the LDPC matrix to encode the codeword. The computer may be arranged to transmit the encoded codeword across a network, such as a wireless network, to another computer or a receiver.

Figure 9:
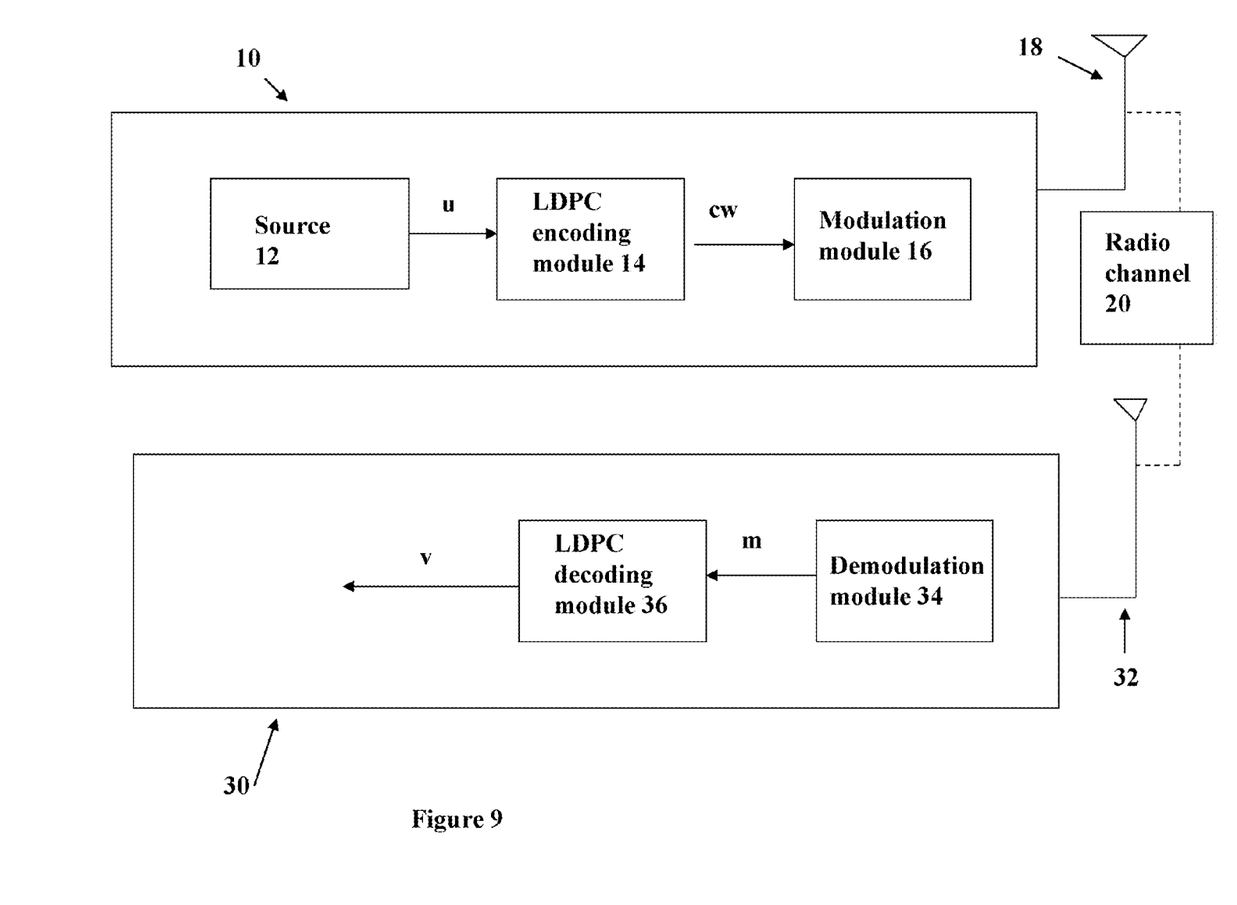
FIG. 9 shows a block diagram of a communication system in accordance with various aspects of the present disclosure.

FIG. 9 shows a block diagram of a communication system in accordance with various aspects of the present disclosure. Transmitter 10 and receiver 30 communicate with each other using a radio channel 20 as a medium. In the transmitter 10, a k-bit source data u outputted from a data source 12 is converted to an n-bit codeword cw by systematic LDPC encoding conducted by an LDPC encoding module 14. The codeword cw can be represented as cw=[u p q], wherein u are the information bits corresponding to the columns of A, p are some of the parity bits corresponding to the columns of B and C, and q are the rest of the parity bits corresponding to the columns of D, as discussed above. The codeword cw is radio-modulated by a modulation module 16 to be transmitted by an antenna 18 via the radio channel 20 and is then received by another antenna 32 of the receiver 30. The receiver 30 goes through a process reverse to that of the transmitter 10. Namely, data m received by receiver 30, which is a noisy estimate of the transmitted cw, is demodulated by a demodulation module 34 to be decoded by an LDPC decoding module 36, whereby an estimate v of the source data u can be finally obtained.

Figure 10:
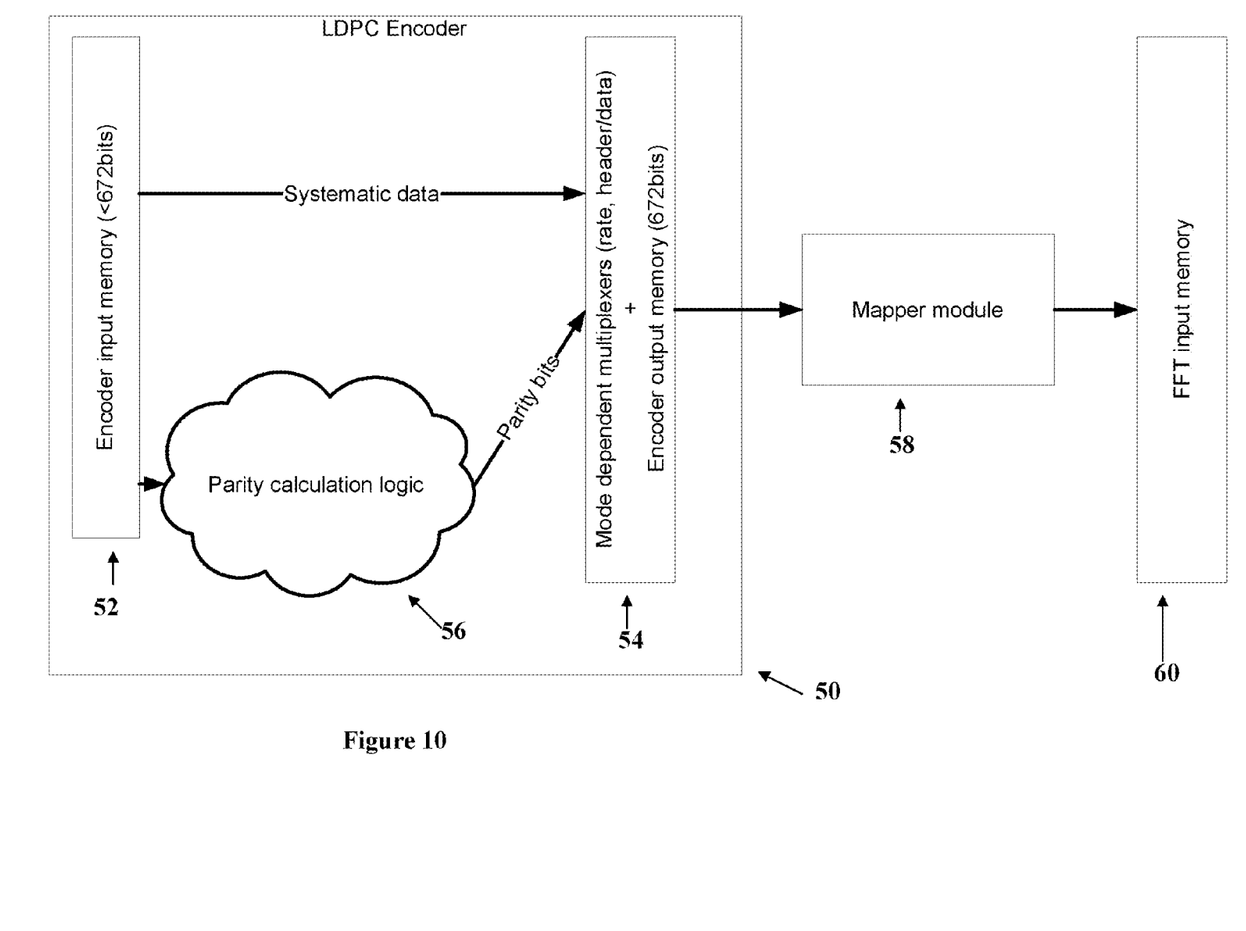
FIG. 10 shows block diagram of an encoding procedure in an orthogonal frequency divisional multiplexing (OFDM) transmitter in accordance with various aspects of the present invention.

FIG. 10 shows block diagram of an encoding procedure in an orthogonal frequency divisional multiplexing (OFDM) transmitter in accordance with various aspects of the present invention. Transmission using OFDM is such that the available spectrum is divided into N orthogonal subcarriers. LDPC encoder 50 includes encoder input memory 52. Data is read from memory 52 and is supplied to mode dependent multiplexers and encoder output memory 54. For example, encoder input memory 52 and encoder output memory 54 are configured to store 672 bits of data. If the encoding is preformed in a single step, the output memory 54 may contain an entire codeword and has a length equal to the codeword length. The input memory 52 is essentially of a shorter length and equal to the length of the information vector. The data supplied to mode dependent multiplexers and encoder output memory 54 includes systematic data, such as information bits, as well as, parity bits. Parity bits are calculated by a parity calculation logic 56. The encoded data from LDPC encoder 50 is mapped onto the subcarrier using a mapper module 58 and conveyed to into an input buffer 60 of Fast Fourier Transform (FFT) module that is responsible to transform its input from a frequency domain into a time domain.

Figure 11:
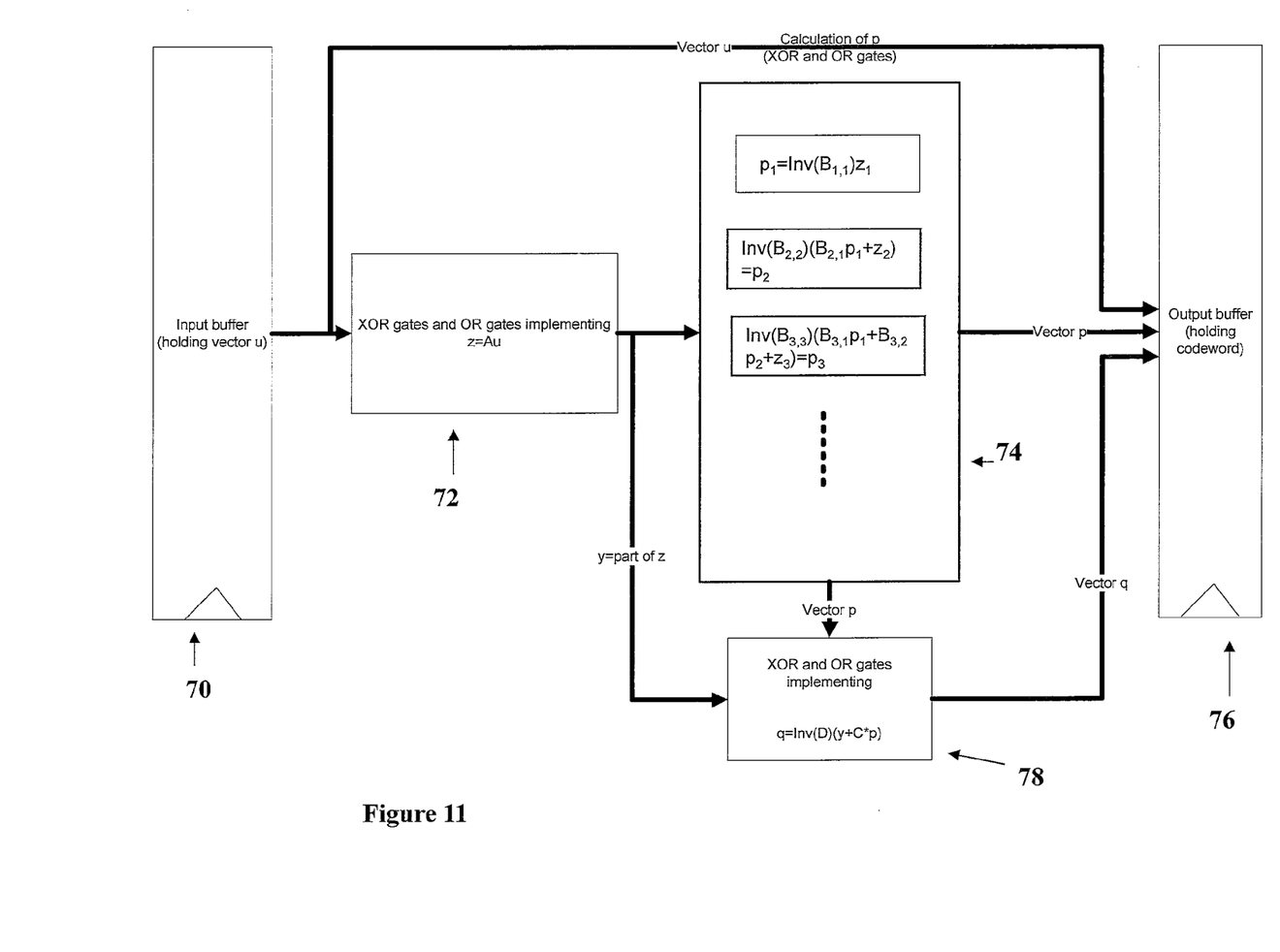
FIG. 11 shows an exemplary LDPC encoder in hardware in accordance with various aspects of the present invention.

FIG. 11 shows an exemplary LDPC encoder in hardware in accordance with various aspects of the present invention. Input buffer 70 is configured to store vector u, which are the information bits corresponding to the columns of sub-matrix A. All or a portion of vector u is read from buffer 70 and is supplied to module 72. Module 72 is configured to include XOR gates and OR gates that are configured to calculate the product of sub-matrix, A, and the vector u. The calculated product is then supplied to module 74 that is configured to calculate the vector p by utilizing XOR and OR gates. The vector p can be represented by $[p_1, p_2, p_3, \ldots, p_{n-1}, p_n]$, where $p_n$ is the last element of vector p. For quasi-cyclic LDPC codes, elements of the vector p represent vectors of size Z. The vector p can be calculated by either forward or backward substitution depending on the triangular structure of the B sub matrix, as discussed above. For example, $p_1$ is calculate by $Inv(B_1,1)z_1$, where the subscript 1,1 represents the element of sub-matrix B occupying row 1 and column 1. The submatrix $B_{1,1}$ may be a permutation sub-matrix as is typical for quasi-cyclic LDPC codes. $P_2$ is calculate by $Inv(B_2,2)(B_2,1\ p_1+z_2)$ and $p_3$ is calculated by $Inv(B_{3,3})(B_{3,1}\ p_1+B_{3,2}\ p_2+z_3)$. All the elements of the vector p is calculated in suitable manner. The calculated vector p is then outputted to an output buffer 76, which is configured to store the codeword cw, and to module 78 which is configured to calculate the vector q. The module 78 is configured to receive y as determined from z by module 72 and may include XOR and OR gates that are configured to calculate q by the expression Inv(D)(y+C*p). The output of module 78 is configured to feed back to module 76.

Although the above disclosure discusses what is currently considered to be a variety of useful embodiments, it is to be understood that such detail is solely for that purpose, and that the appended claims are not limited to the disclosed embodiments, but, on the contrary, is intended to cover modifications and equivalent arrangements that are within the spirit and scope of the appended claims.

What is claimed is:

1. A method comprising:
encoding an information word to generate a codeword using a low density parity check matrix using an encoder, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoding performed over the second sub-matrix before the third sub-matrix, wherein the encoding performed over the second sub-matrix provides the first subset of the parity check symbols, and the encoding performed over the third sub-matrix provides the second subset of the parity check symbols, and wherein the encoding performed over the third sub-matrix to compute the second subset of the parity check symbols uses at least the first subset of the parity check symbols and an inverse of the third sub-matrix.

2. The method according to claim 1, wherein the codeword includes information symbols corresponding to columns of the first sub-matrix, parity check symbols corresponding to columns of the second sub-matrix and parity check symbols corresponding to columns of the third sub-matrix.

3. The method according to claim 1, wherein the encoding includes calculating a product of the first sub-matrix and a vector representing the information symbols corresponding to columns of the first sub-matrix.

4. The method according to claim 3, wherein the product is represented as a vector having a first part corresponding to rows of the second sub-matrix and a second part corresponding to rows of the third sub-matrix.

5. The method according to claim 4, wherein the encoding includes calculating parity check symbols corresponding to columns of the second sub-matrix by backward or forward substitution using the second sub-matrix and the first part of the vector corresponding to rows of the second sub-matrix.

6. The method according to claim 5, wherein the encoding includes calculating a sum of the second part of the vector corresponding to rows of the third sub-matrix and a product of a fourth sub-matrix of the low density parity check matrix and parity check symbols associated with the second sub-matrix.

7. The method according to claim 6, wherein the encoding includes calculating parity check symbols associated with the third sub-matrix by using the calculated sum and the inverse of the third sub-matrix.

8. The method according to claim 1, wherein each entry of the low density parity check matrix represents either an invertible matrix or an all-zero matrix of size Z×Z.

9. The method according to claim 1, wherein the third sub-matrix has an inverse matrix which is sparse.

10. The method according to claim 9, wherein the inverse matrix is expressed as a sum of two quasi cyclic matrices.

11. The method according to claim 8, wherein Z=1, Z=28 or Z=42.

12. The method according to claim 1, wherein the codeword is 672 bits in length.

13. The method according to claim 1, wherein the low density parity check matrix is over the binary field.

14. An apparatus comprising:
an encoder configured to encode an information word to generate a codeword using a low density parity check matrix, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoder configured to perform the encoding over the second sub-matrix before the third sub-matrix, wherein the encoding performed by the encoder over the second sub-matrix provides the first subset of the parity check symbols, and the encoding performed over the third sub-matrix provides the second subset of the parity check symbols, and wherein the encoder computes an inverse of the third sub-matrix, and uses at least the first subset of the parity check symbols and the inverse of the third sub-matrix to perform encoding over the third sub-matrix to compute the second subset of the parity check symbols.

15. The apparatus according to claim 14, wherein the encoder is configured to calculate a product of the first sub-matrix and a vector representing the information symbols corresponding to columns of the first sub-matrix.

16. The apparatus according to claim 15, wherein the product is represented as a vector having a first part corresponding to rows of the second sub-matrix and a second part corresponding to rows of the third sub-matrix.

17. The apparatus according to claim 16, wherein the encoder is configured to calculate parity check symbols corresponding to columns of the second sub-matrix by backward or forward substitution using the second sub-matrix and the first part of the vector corresponding to rows of the second sub-matrix.

18. The apparatus according to claim 17, wherein the encoder is configured to calculate a sum of the second part of the vector corresponding to rows of the third sub-matrix and a product of a fourth sub-matrix of the low density parity check matrix and parity check symbols associated with the second sub-matrix.

19. A computer program product comprising:
a non-transitory computer usable medium having a computer readable program code embodied therein, said computer readable program code adapted to be executed to implement a method comprising:
encoding an information word to generate a codeword using a low density parity check matrix, the low density parity check matrix comprising a first sub-matrix associated with information symbols, a second sub-matrix having a block triangular structure associated with a first subset of parity check symbols and a third sub-matrix that is invertible and associated with a second subset of parity check symbols, the encoding performed over the second sub-matrix before the third sub-matrix, wherein the encoding performed over the second sub-matrix provides the first subset of the parity check symbols, and the encoding performed over the third sub-matrix provides the second subset of the parity check symbols, and wherein the encoding performed over the third sub-matrix to compute the second subset of the parity check symbols uses at least the first subset of the parity check symbols and an inverse of the third sub-matrix.

20. The computer program product according to claim 19, wherein each entry of the low density parity check matrix represents either an invertible matrix or an all-zero matrix of size Z×Z.

* * * * *